United States Patent
Hu et al.

(10) Patent No.: US 11,929,267 B1
(45) Date of Patent: Mar. 12, 2024

(54) REFLECTOR AND/OR METHOD FOR ULTRAVIOLET CURING OF SEMICONDUCTOR

(71) Applicant: Taiwan Semiconductor Manufacturing Company, Hsinchu (TW)

(72) Inventors: Chien-Chun Hu, Taichung (TW); Kuang-Wei Cheng, Hsinchu (TW); Chyi-Tsong Ni, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/889,556

(22) Filed: Aug. 17, 2022

(51) Int. Cl.
*H01L 21/67* (2006.01)
*B05D 3/06* (2006.01)
*H01L 21/02* (2006.01)

(52) U.S. Cl.
CPC ........ *H01L 21/67115* (2013.01); *B05D 3/067* (2013.01); *H01L 21/02348* (2013.01)

(58) Field of Classification Search
CPC .............. B05D 3/067; H01L 21/02348; H01L 21/67115
See application file for complete search history.

(56) References Cited

U.S. PATENT DOCUMENTS

| | | | | |
|---|---|---|---|---|
| 4,563,589 A * | 1/1986 | Scheffer | ............. | B41F 23/0409 362/218 |
| 6,208,466 B1 * | 3/2001 | Liu | ............. | G02B 5/0252 359/590 |
| 7,566,891 B2 * | 7/2009 | Rocha-Alvarez | ...... | B05D 3/067 250/493.1 |
| 9,433,973 B1 * | 9/2016 | Ni | ........ | C23C 16/4409 |
| 10,283,637 B2 * | 5/2019 | Hung | .............. | H05B 3/0047 |
| 2003/0052279 A1 * | 3/2003 | Kikuchi | .............. | G03F 7/2008 250/455.11 |
| 2007/0041087 A1 * | 2/2007 | Kanaya | .............. | F21V 7/28 359/359 |
| 2007/0257205 A1 * | 11/2007 | Rocha-Alvarez | ...... | B05D 3/067 250/492.1 |
| 2012/0120168 A1 * | 5/2012 | Kachi | .............. | B41J 11/00218 347/102 |
| 2012/0281049 A1 * | 11/2012 | Kachi | .............. | B41J 11/00214 347/102 |
| 2016/0334649 A1 * | 11/2016 | Merrill | .............. | B05D 5/063 |
| 2018/0061685 A1 * | 3/2018 | Ni | .............. | B05D 3/067 |
| 2018/0320831 A1 * | 11/2018 | Li | .............. | B23K 3/047 |
| 2020/0365428 A1 * | 11/2020 | Tseng | .............. | B05D 3/067 250/492.1 |

\* cited by examiner

*Primary Examiner* — Karl Kurple
(74) *Attorney, Agent, or Firm* — Lippes Mathias LLP

(57) ABSTRACT

An ultraviolet (UV) lamp assembly of a UV curing tool is provided for curing a low dielectric constant (low-k) material layer of a semiconductor wafer. The UV lamp assembly includes: a UV lamp which emits UV light; a first reflector arranged proximate to a first side of the UV lamp, the first reflector including a first surface facing the UV lamp from which UV light emitted by the UV lamp is at least partially reflected; and a UV reflective coating partially coating the first surface of the reflector. Suitably, a plurality of areas of the first surface of the reflector remain uncoated with the UV reflective coating and the plurality of uncoated areas are arranged to promote a uniform exposure of the semiconductor wafer to UV irradiation.

20 Claims, 3 Drawing Sheets

REFLECTOR AND/OR METHOD FOR ULTRAVIOLET CURING OF SEMICONDUCTOR

BACKGROUND

The following relates to the semiconductor arts, and in particular, to a method and/or apparatus for ultraviolet (UV) curing of a semiconductor wafer, device and/or substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
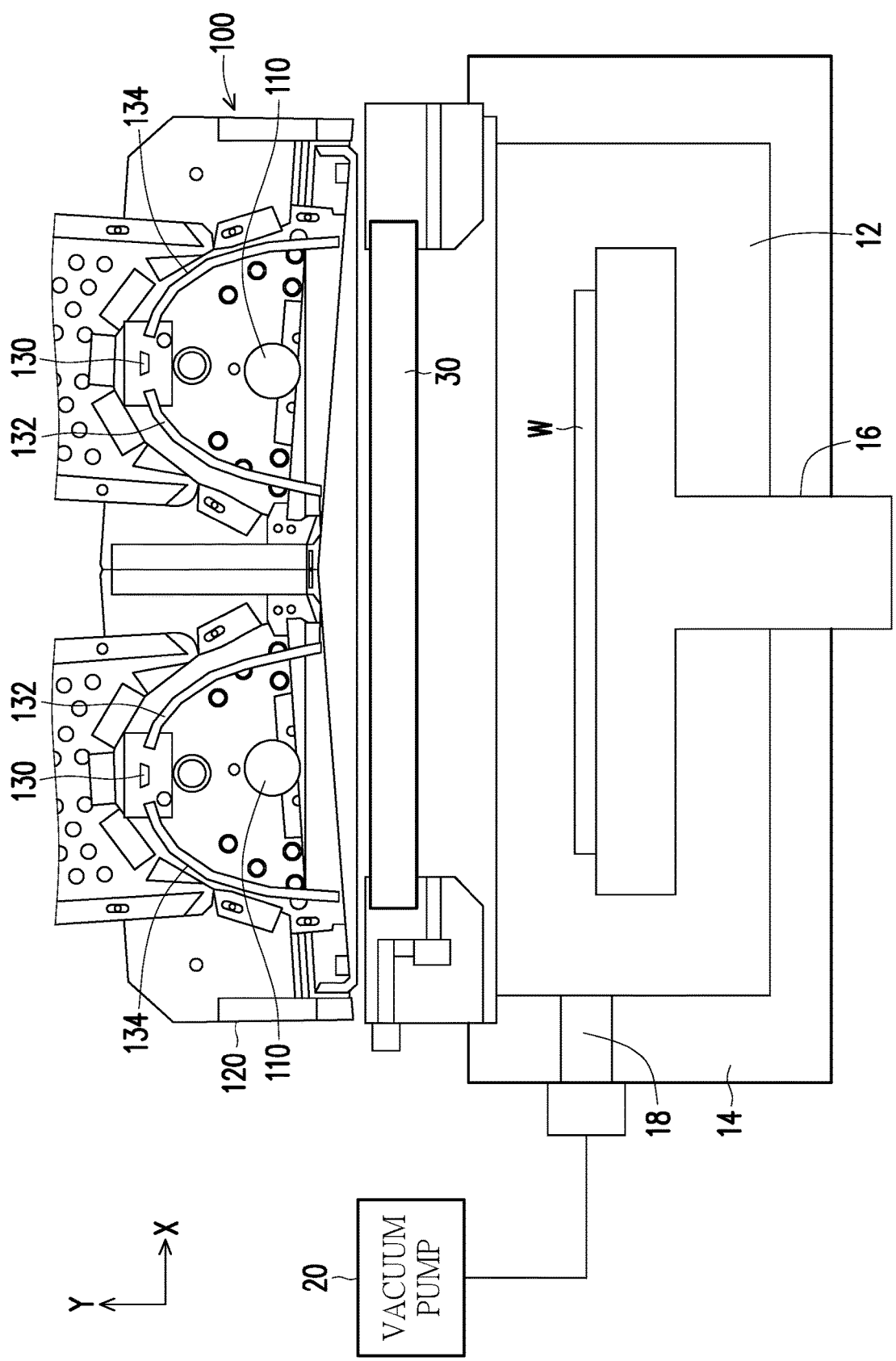
FIG. 1 diagrammatically illustrates an ultraviolet (UV) curing tool, oven and/or apparatus in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, low dielectric constant (low-k) materials are used in the fabrication of semiconductor devices for a variety of different purposes and/or functions. In some cases, for example, low-k materials may be used as a means to reduce resistance capacitance (RC) delay time which can inhibit device performance speed and increase power consumption. In some cases, low-k materials can be used, for example, as inter-metal dielectric (IMD) and inter-layer dielectric (ILD) structures between conductive traces to improve semiconductor device performance, particularly, as such devices and circuits therein continue to shrink in size with advances in semiconductor fabrication technology.

Suitably, low-k material thin films or layers may be deposited or formed on a semiconductor wafer or substrate by any of various chemical vapor deposition (CVD) techniques (for example, such as flowable CVD (FCVD)), spin coating, or other suitable material deposition and/or thin film or layer producing processes. In some suitable embodiments, these low-k material thin films or layers are cured after deposition, for example, by irradiation with and/or exposure to UV light or radiation, for any one or more of a variety of reasons. In some cases, UV curing may be used to improve and/or restore the physical properties to the film material, for example, such as increasing elastic modulus or hardness to improve mechanical strength for higher packaging yields and/or to better withstand post-film deposition processes such as etching, chemical cleaning, chemical mechanical polishing (CMP), wire bonding, etc. In addition, UV curing may be employed, for example, to repair damage to the film caused by chemicals such as fluorine and nitrogen, and to restore the low-k properties of the film which may increase during some post-film deposition processes.

In accordance with some suitable embodiments disclosed herein, there is the advantage of having a substantially uniform UV curing intensity and/or irradiation achieved over the entire surface or substantially the entire surface of the semiconductor wafer or substrate undergoing treatment to avoid various problems which could otherwise result from uneven UV curing intensity and/or irradiation. For example, one advantage of having a substantially uniform UV curing intensity and/or irradiation is that it protects against potential film shrinkage at portions of the semiconductor wafer or substrate that may be otherwise disproportionately exposed to greater levels of UV irradiation, which in turn may result in variability in the performance of the semiconductor device or devices being fabricated. Accordingly, one advantage of some suitable embodiments disclosed herein is greater thickness uniformity in the low-k material thin film or layer being UV cured, for example, due at least in part to greater uniformity in the UV curing intensity and/or irradiation applied. This is a particular advantage for larger semiconductor wafer or substrate sizes, for example, with diameters in a range of between from about 300 millimeters (mm) to about 450 mm, inclusive, where non-uniformity in UV curing intensity and/or irradiation can cause problems to be exacerbated.

In some suitable embodiments disclosed herein, an ultraviolet (UV) curing tool, oven and/or apparatus is provided for the UV curing of a semiconductor wafer, substrate and/or device. More specifically, in some embodiments, the UV curing tool, oven and/or apparatus is used for the curing of a low dielectric constant (low-k) thin film or layer coated or otherwise provided on the semiconductor wafer and/or substrate. For example, the low-k film or layer may have a dielectric constant or relative permittivity of less than or equal to about 3.5. In another example, the low-k film or layer may have a dielectric constant or relative permittivity of less than or equal to about 3.0.

FIG. 1 shows a UV curing tool, oven and/or apparatus 10 in accordance with some suitable embodiments disclosed herein. In the illustrated embodiment, the UV curing tool, oven and/or apparatus 10 includes a process chamber 12, for example, defined at least in part by a set of walls, floor, ceiling or housing 14. In some suitable embodiments, the process chamber 12 is an environmentally controlled space that can be substantially isolated from ambient conditions outside the process chamber 12. Controlled conditions within the process chamber 12 may include, without limitation, the pressure, the temperature, the makeup, mixture or content and/or flow of a process gas or purge gas or cooling gas or other gas within the process chamber 12, and the like.

In practice, the housing 14 may include a door (not shown) or the like through which a semiconductor wafer W or substrate may be selectively loaded and/or unloaded into and/or from the process chamber 12. For example, the semiconductor wafer W or substrate may be coated with or otherwise include a thin film or layer of low-k material which is to undergo UV curing within the process chamber 12. For example, the thin film or layer of low-k material may be coated and/or deposited on the semiconductor wafer W or substrate via any suitable material deposition or thin film or layer producing process including, but not limited to, CVD, FCVD, spin coating or the like. In some suitable embodiments, the low-k material may have a dielectric constant or relative permittivity of less than or equal to about 3.5.

In some suitable embodiments, an automated material handling system (AMHS), for example, including an equipment front end module (EFEM) and/or one or more robotic arms or the like, may be employed to selectively load and/or unload the semiconductor wafer W or substrate into and/or from the process chamber 12. Suitably, while the semiconductor wafer W or substrate is undergoing a suitable UV curing process within the process chamber 12, the door of the housing 14 may be shut, closed and/or sealed so that a pressure, temperature, gas, gas flow and/or otherwise controlled environment can be effectively established and/or maintained within the process chamber 12.

In some suitable embodiments, as shown in FIG. 1, a mounting assembly 16 may be contained within the process chamber 12. In practice, the mounting assembly 16 may include a pedestal or mount or other suitable structure that provides a location where the semiconductor wafer W or substrate may be positioned within the process chamber 12. In some suitable embodiments, the mounting assembly 16 may include a suitable chuck, for example, a vacuum chuck or an electrostatic chuck, or the like which may hold or secure the semiconductor wafer W or substrate in place on the mounting assembly 16. In some suitable embodiments, the mounting assembly 16 may further include a heater or the like which is selectively operable to heat and/or maintain the semiconductor wafer W or substrate positioned on the mounting assembly 16 to and/or at a suitable operating temperature, for example, at which a suitable UV curing process is carried out within the process chamber 12. In some suitable embodiments, the mounting assembly 16 may include a support, for example, such as heated pedestal, having a generally circular shaped platter or table which is configured and/or structured to support the semiconductor wafer W or substrate selectively placed thereon. The platter, table and/or pedestal may be made of any suitable material capable of withstanding the temperature, pressure, and environment experienced within process chamber 12, for example, including without limitation ceramic or metal, such as aluminum. In some suitable embodiments, the pedestal may further include a shaft, for example, optionally coupled to a motor drive unit which is configured and/or operable to selectively raise and/or lower the semiconductor wafer W or substrate within process chamber 12, and in some optional embodiments rotate the platter or table with the semiconductor wafer W or substrate thereon during a suitable UV curing process.

In some suitable embodiments, as shown in FIG. 1, the process chamber 16 of the UV curing tool, oven and/or apparatus 10 may be in fluid communication with an exhaust port 18 through which gas may be selectively drawn from the process chamber 12. In practice, the exhaust port 18 may be operatively connected to a vacuum pump 20 or the like which is operated and/or controlled to selectively create and/or maintain a desired pressure within the process chamber 12 and/or remove or otherwise exhaust gas from and/or create a gas flow through the process chamber 12. In some suitable embodiments, during a suitable UV curing process carried out within the process chamber 12, the process chamber 12 may be maintained at a suitable pressure which may be substantially below atmospheric pressure, for example, near or approaching or substantially at a vacuum, and accordingly at times, the process chamber 12 may be referred to as a vacuum chamber, however a strict vacuum may not in fact be established or achieved within the process chamber 12.

In some suitable embodiments, the UV curing tool, oven and/or apparatus 10 may further include a gas cooling system that supplies an inert or other gas to the process chamber 12. In practice, the cooling gas may help maintain temperatures in the process chamber 12 at a desired level, for example, which may be below 450 degrees Celsius (° C.) in some representative non-limiting embodiments. In some suitable embodiments, the cooling gas also serves as a purge gas, which may to help remove various organic compounds or other species, for example, outgassed from the semiconductor wafer W or substrate or the thin coating or layer of low-k material deposited thereon, during the UV curing process applied within the process chamber 12. In some suitable embodiments, nitrogen ($N_2$) may be used as the cooling gas; however, in other suitable embodiments, another suitable inert or noble gas may be used. In practice, the cooling gas may be introduced into the process chamber 12 through any suitable number and/or arrangement of inlet conduits or ports, for example, from a suitable gas source or supply. Suitably, the cooling gas is drawn into and removed from the process chamber 12 by the exhaust port 18, which may include a header, for example, containing multiple holes connected to an outlet conduit. Out-gassing from the semiconductor wafer W and/or low-k material layer thereon, for example, produced during the UV curing process, is removed from the process chamber 12 along with the inert cooling gas through the exhaust port 18. In some suitable embodiments, the exhaust port 18 may be connected to a vacuum source, for example, such as the vacuum pump 20, and the process chamber 12 may be operated under pressure less than atmospheric. In some suitable embodiments, the process chamber 12 may be held at or near a vacuum, atmospheric (for example, less than or equal to about 10 ton per square inch (tsi)), or positive pressures.

In some cases, the UV curing process may be sensitive to oxygen ($O_2$) in the process chamber 12. Accordingly, in some suitable embodiments, one or more $O_2$ sensors may be provided in the process chamber 12 to monitor $O_2$ levels during the applied UV curing process and detect if $O_2$ levels become high enough to present potential processing problems.

In accordance with some suitable embodiments, the UV curing process performed in UV curing tool, oven and/or apparatus 10 may be conducted at any suitable pressure and temperature. In one non-limiting example, an operating temperature in a range of between from about 300° C. to about 410° C., inclusive, is used. In general, operating temperatures above 410° C. may not be used, for example, due to thermal budget and device concerns for the semiconductor wafer W. In some embodiments, the operating pressure is within a range of between from about 1 tsi to about 10 tsi, inclusive, for example, for better curing uniformity control.

With continuing reference to FIG. 1, in some suitable embodiments, the UV curing tool, oven and/or apparatus 10 may further include a UV light source and/or lamp unit 100. The UV light source and/or lamp unit 100 may include an array or plurality of lamp assemblies each including a UV lamp 110 that generates and/or emits UV wavelength radiation or light. As shown in FIG. 1, the UV light source and/or lamp unit 100 includes two lamp assemblies and/or UV lamps 110.

In practice, the semiconductor wafer W or substrate is positioned, for example, on the mounting assembly 16, in optical view of the UV lamps 110 within the process chamber 12 to receive UV radiation or light from the UV lamps 110 in connection with a suitable UV curing process being carried out in the process chamber 12. Suitably, the UV lamps 110 may be held and/or mounted by and/or in appropriate lamp holders which are supported by a suitable portion of an enclosure or housing 120 of the UV light source and/or lamp unit 100. In some suitable embodiments, the UV light source and/or lamp unit 100 may be fixed and/or stationary in position, for example, with respect to the process chamber 12. In some suitable embodiments, the UV light source and/or lamp unit 100 may be selectively movable with respect to the process chamber 12, for example, in order to more evenly expose the semiconductor wafer W or substrate to UV irradiation. For example, the UV light source and/or lamp unit 100 may be configured to translate laterally or otherwise scan back and forth with respect to the process chamber 12 and/or to rotate or revolve with respect to the process chamber 12, for example, about a central horizontal axis. In practice, any suitable mechanical linkage or like mechanism may be used to selectively move the UV light source and/or lamp unit 100, for example, under the power of an electric motor or other suitable actuator. Advantageously, the selective movement of the UV light source and/or lamp unit 100 during a suitable UV curing process being performed in the process chamber 12 can help promote uniform UV irradiation of the semiconductor wafer W or substrate and/or minimize or eliminate high intensity UV "hot spots" thereon, for example, which can be prone to causing shrinkage of the low-k material thin film or layer being cured and consequent device problems.

As shown in FIG. 1, the UV light source and/or lamp unit 100 is positioned above the process chamber 12 in accordance with some suitable embodiments. In some suitable embodiments, a window 30 separates and/or isolates the process chamber 12 from the UV light source and/or lamp unit 100. In practice, the window 30 may be transparent or substantially transparent to UV radiation and/or light in the operative wavelength or wavelengths of the UV curing tool, oven and/or apparatus 10. For example, the window 30 may be made of quartz (SiO$_2$) or anther suitable material. As shown in FIG. 1, the window 30 is positioned and/or seated in the housing 14 of the process chamber 12 above the semiconductor wafer W or substrate to operatively seal the processing chamber 12 from the ambient environment and UV light source and/or lamp unit 100. Advantageously, the window 30 prevents out-gassing from the semiconductor wafer W and/or low-k material deposited or coated thereon from reaching and potentially contaminating the UV lamps 110. In practice, the window 30 operates to allow UV wavelength radiation or light from the UV light source and/or lamp unit 100 to be transmitted and pass through the window 30 and irradiate a semiconductor wafer W positioned below the window 30. In some suitable embodiments, the window 30 may be made of synthetic quartz. In some non-limiting embodiments, the window 30 in the UV curing tool, oven and/or apparatus 10 has a size sufficient to accommodate the passing therethrough of UV light or radiation simultaneously from all of the UV lamps 110.

In some suitable embodiments, the window 30 may be formed or modified or otherwise configured to help produce a more uniform UV irradiation of the semiconductor wafer W or substrate position in the process chamber 12, for example, to help minimize or eliminate am otherwise relatively high UV intensity dosed central region of the semiconductor wafer W or substrate. That is to say, in some cases, the UV radiation or light striking the semiconductor wafer W at or near a central portion thereof (i.e., at and/or proximate to a geometric center of the semiconductor wafer W) can tend to be amplified or multiplied, for example, by collimated converging and crossing UV rays generated by each of the two UV lamp assemblies. This can tend produces an additive irradiation effect in which the central portion of the semiconductor wafer W or substrate is irradiated with a higher UV intensity or dose than outer peripheral regions of the semiconductor wafer W. Accordingly, this central portion of the semiconductor wafer W can experience higher shrinkage, which can adversely affect the performance of devices built in that central area.

To help address the foregoing relatively high UV intensity situation, the optical properties of a selected portion or portions of the window 30 (for example, associated with the otherwise the high intensity UV irradiation) may optionally be formed or modified to help reduce or eliminate the converging and/or additive UV ray effect, thereby helping to produce more normalized and uniform UV intensity levels across the entire surface of the semiconductor wafer W.

In some suitable embodiments, the window 30 is optionally provided or formed with a UV radiation modifier which operates to produce a diverging UV ray pattern, thereby redirecting the incident converging UV rays on the modifier before they reach the semiconductor wafer W below to help eliminate or minimize the high UV intensity "hot spots" in the central region of the semiconductor wafer W. As the term is used herein, "UV radiation modifier" includes any device or substance that is operable to alter the intensity and/or direction of UV wavelength radiation.

In some suitable embodiments, UV radiation modifier may take the form of a negative or diverging lens which is mounted to or formed integrally with the window 30. For example, the diverging lens may be located at or near a geometric center of the window 30; however, one or more lenses may be provided at any location(s) in the window 30 where needed to redirect converging UV rays from lamps 110 which are associated with causing relatively high UV intensity regions on the semiconductor wafer W. In some non-limiting embodiments, the lens or lenses may be circular in configuration and have a suitable diameter selected to help minimize or eliminate the relatively high UV intensity situation. In other embodiments contemplated, lens or lenses may have other suitable configurations, for example, depending on the size and/or shape of the window 30 and/or the locations of the relatively high UV intensity areas encountered. In various embodiments, diverging lenses may be biconcave lenses, or alternatively a plano-concave. In practice, optionally employed diverging lenses may have any suitable refractive index for the given application. In some suitable embodiments, one or more diverging lenses may be formed as an integral unitary structural portion of the monolithic window 30 itself. In such a case, the lenses may be formed while fabricating the window 30 and/or the lenses may be ground into the window 30 thereafter using any of a variety of lens grinding equipment and techniques. In practice, surfaces of lenses may be polished like a conventional optical lens in some embodiments. In alternative embodiments, diverging lenses may be formed separately from the window 30 as a discrete component and thereafter mounted or attached to the window 30 by any suitable means including without limitation adhesives, shrink fitting, heat welding, etc. In some embodiments, one or more diverging lenses may be formed in or incorporated into the window 30 so that the lenses are at least partially embedded into the window. In operation, the UV rays incident on and refracted through diverging lenses will have a dispersed and outwardly divergent pattern to avoid the amplification or multiplication effect of UV radiation from the UV lamps 110. This will, in turn, produce a more uniform distribution of UV intensity over the entire surface of the semiconductor wafer W, thereby helping to eliminate or minimizing the shrinkage problems and increasing device yield.

In some alternate embodiments, instead of and/or in addition to redirecting the converging UV rays away from the center of the window 30 as described above, a UV radiation modifier is optionally provided according to the present disclosure by selectively applying an optional UV light absorbing optical coating directly onto a surface of the window 30, for example, the upper surface thereof facing the UV light source and/or lamp unit 100. The UV light absorbing coating may be optionally applied to one or more portions or areas of the window 30, for example, that correspond to relatively high UV intensity locations experienced on the semiconductor wafer W or substrate below. In some suitable embodiments, the UV light absorbing coating may be applied proximate to a center of the window 30, and/or at a single or multiple other off-center locations on the window 30 depending on where the coating would advantageously reduce the UV intensity on the semiconductor wafer W below. The extent of surface area occupied by coating and the configuration of the coated regions on the window 30 may be selected depending on the corresponding extent of the relatively high UV intensity areas which would otherwise be experienced on the semiconductor wafer W. In practice, the surface area occupied by any of the UV radiation modifiers described herein (i.e., diverging lenses or UV absorbing coating) will be less than the total surface area of the window 30. For example, suitable materials for UV light absorbing coating include, without limitation, titanium dioxide ($TiO_2$), alumina ($Al_2O_3$), dielectric SiON, TiNi, TiON and others. In practice, these materials effectively absorb some of the UV light or radiation, but allow a portion of the UV radiation or rays to pass through window 30 to semiconductor wafer W below. Since the amount of UV radiation absorbed may depend on the thickness of the coating, an appropriate thickness for the coating may be selected based on the incident UV intensity levels on the window 30 and the amount of UV radiation desired to be blocked/captured by the coating to produce substantially uniform irradiation of the semiconductor wafer W thereby helping to eliminate or minimize "hot spots." In some representative examples, without limitation, the UV light absorbing coating may have a thickness in a range of between from about 10 angstroms (A) to about 1000 A, inclusive.

In some suitable embodiments, each lamp assembly may include or each UV lamp 110 may have associated therewith a corresponding set of reflectors, for example, including but not limited to: a top reflector 130, an inside reflector 132 and an outside reflector 134, arranged at least partially about the corresponding UV lamp 110. Suitably, each of the respective reflectors 130, 132 and 134 may be held and/or mounted by and/or in appropriate reflector holders which are supported by a suitable portion of the enclosure or housing 120 of the UV light source and/or lamp unit 100.

As shown in FIG. 1, the reflectors 130, 132 and 134 may be positioned above (see, for example, the top reflectors 130) and extend at least partially downward around the sides (see, for example, the inside reflector 132 and outside reflectors 134) of each of the lamps 110 to at least partially reflect the UV ration or light emitted from the lamps 110 downwards through the window 30 towards the process chamber 12, for example, thereby enhancing the UV irradiation and/or curing of the thin film or layer of low-k material previously deposited on the semiconductor wafer W or substrate, for example, by any suitable means including but not limited to CVD, FCVD or spin coating.

In some suitable embodiments, each respective set of reflectors 130, 132 and 134 may be positioned and/or arranged proximate to their corresponding lamp 110 to at least partially reflect the UV radiation or light produced by the corresponding lamp 110 generally toward the semiconductor wafer W or substrate positioned on the mounting assembly 16 within the process chamber 12. As shown in FIG. 1, in each lamp assembly the corresponding set of the top, interior and exterior reflectors 130, 132 and 134 may collectively form a substantially concave-shaped partial enclosure or arc about the corresponding individual lamp 110. In some suitable embodiments the reflectors 130, 132 and 134 may be made of any suitable coated, partially coated or uncoated metal or other material having a reflective surface finish or coating which is operable to reflect UV radiation or light. In one embodiment, without limitation, the reflectors 130, 132 and 134 may be formed of aluminum and coated or at least partially coated with a UV reflective coating on the surface thereof facing the corresponding UV lamp 110.

In practice, any suitable type of UV lamp 110 may be used including without limitation mercury and excimer lamps, mercury microwave arc lamps, pulsed xenon flash lamps, UV light emitting diodes, etc. In some suitable embodiments, the UV lamps 110 are elongated tube-type UV lamps 110 which are arranged in spaced and parallel relationship to each other, for example, extending along a direction normal or substantially normal to the X-Y plane as shown in FIG. 1. For ease of reference and illustrative purposes herein, the FIGURES and the various elements and/or components depicted therein are shown relative to an otherwise arbitrarily chosen 3D cartesian coordinate system including X, Y and Z axes as shown in the FIGURES. While consistency is maintained among and/or across the various FIGURES, it is to be appreciated the directions and/or orientations indicated by these axes are chosen primarily for the purpose of facilitating the description provided herein, for example, to describe and/or identify relative orientations and/or directions. Unless otherwise indicated, the illustrated coordinate system, in and of itself, is not intended to be limiting and should not be read or interpreted as such.

In some suitable embodiments, the UV lamps 110 may be powered by any suitable power supply usable to energize the UV lamps 110. In some suitable embodiments, the UV lamps 110 may be selected to produce UV radiation or light having any appropriate wavelength or wavelengths for the UV curing process being applied. As an example, without limitation, the UV radiation wavelength or wavelengths used may be in a range of between from about 193 nanometers (nm) to about 500 nm, inclusive. In some suitable embodiments, the UV radiation wavelength or wavelengths used may be in a range of between from about 200 nm to about 400 nm, inclusive.

In some suitable embodiments, the UV curing tool, oven and/or apparatus 10 may include a gas cleaning system. During operation, organic material deposits and/or the like may tend to form on the interior walls of the housing 14, the window 30 and/or other components and/or elements within the process chamber 12 during the UV curing process conducted in the process chamber 12. That is to say, the UV curing process may produce out-gassing of organic compounds and/or the like from the semiconductor wafer W and/or low-k material film and/or layer thereon. Accordingly, contaminates and/or other deposits may tend to buildup on interior surfaces, components and/or elements within the process chamber 12 over one or more repeated applications of suitable UV curing processes within the process chamber 12. Therefore, in practice, periodically or intermittently between UV curing cycles, remote plasma cleaning (RPC) of the process chamber 12 may be performed by introducing a cleaning gas, for example, such as $O_2$, into the process chamber 12, for example, through one or more flow nozzles. Suitably, a reaction of the cleaning gas with UV radiation, for example, generated by the UV lamps 110 produces ozone which removes the organic deposits from within the process chamber 12. The "dirty" cleaning gas stream may be removed from chamber 12 via the exhaust port 18.

Figure 2:
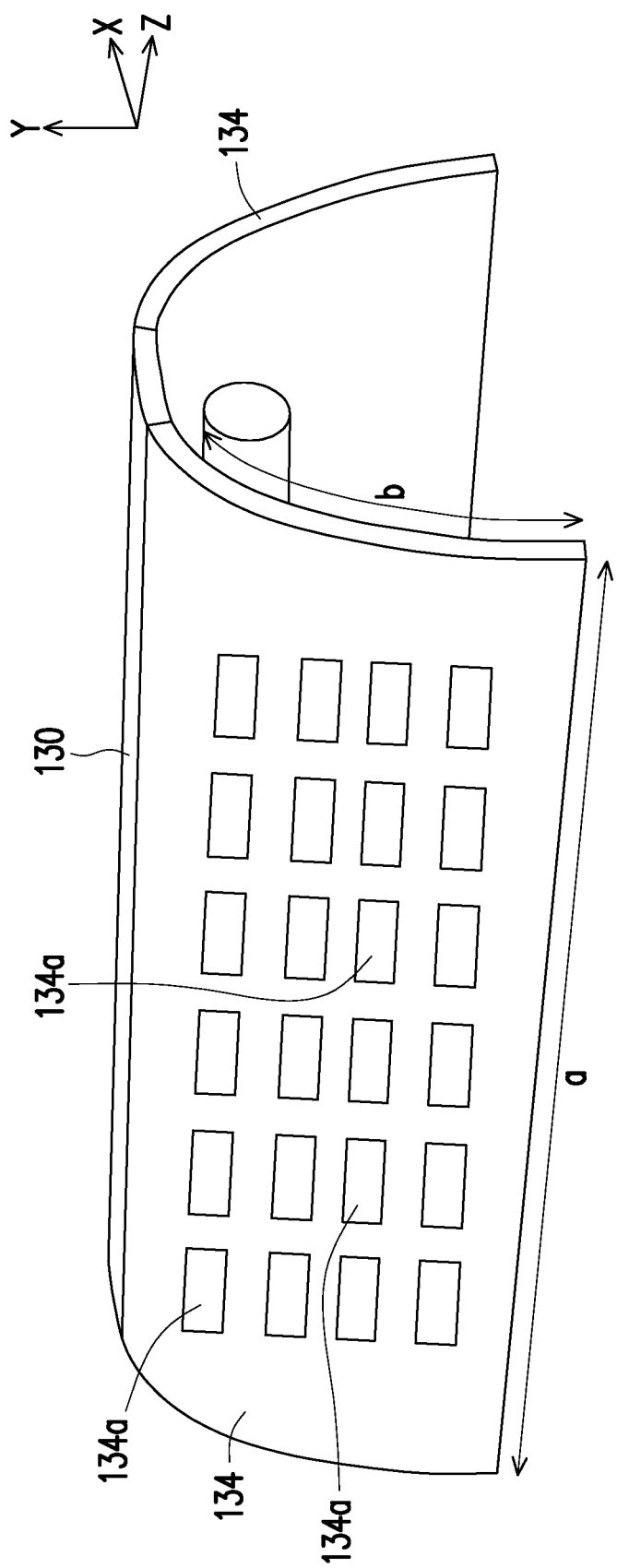
FIG. 2 diagrammatically illustrates a perspective view of a set of UV reflectors for a lamp assembly in accordance with some embodiments disclosed herein.

With reference now to FIG. 2, a set of reflectors (i.e., a top reflector 130, interior reflector 132 and exterior reflector 134) for a lamp assembly of the UV light source and/or lamp unit 100 is shown in accordance with some suitable embodiments disclosed herein. In some suitable embodiments, an inside or lamp-facing surface of the exterior reflector 134 is partially coated with a UV reflective coating. In some suitable embodiment, the UV reflective coating may optionally comprise, for example, aluminum (Al), magnesium fluoride ($MgF_2$) or aluminum fluoride ($AlF_3$) protected Al films, multilayer dielectric interference coatings [for example, including alternating layers of high index of refraction material layers (such as, without limitation $Al_2O_3$, $HfO_2$, $ZrO_2$, and $Sc_2O_3$) with low index of refraction material layers (such as, without limitation, $SiO_2$, $CaF_2$, and $MgF_2$)] and/or other suitable UV reflective coating materials. In some suitable embodiments, the UV reflective coating is a $ZrO_2/SiO_2$ coating.

More specifically, in some suitable embodiments, the inside surface of the exterior reflector 134 which faces its corresponding lamp 110 is only partially coated or otherwise non-uniformly coated and/or discontinuously coated with the UV reflective coating. That is to say, the UV reflective coating on the inside or lamp-facing surface of the exterior reflector 134 is discontinuous or non-uniform, for example, with areas or regions 134a thereof having no or substantially no UV reflective coating on the inside or lamp-facing surface. For illustrative purposes, the UV reflective coating free areas or regions 134a (i.e., the regions or areas where the UV reflective coating is omitted or missing) are diagrammatically indicated and/or represented by the illustrated rectangles labeled with the reference numeral 134a. For illustrative purposes, in FIG. 2 the rectangles diagrammatically representing the UV reflective coating free areas or regions 134a may appear to be shown on an outside surface (i.e., the surface facing away from the UV lamp 110) of the exterior reflector 134; however, in actuality and/or practice, these coating free areas and/or regions 134a reside on the inside or lamp-facing surface of the exterior reflector 134. While for simplicity and/or clarity herein, only one exterior reflector 134 for one lamp 110 or lamp assembly is shown in FIG. 2, it is to be appreciated that the exterior reflector 134 for the other lamp 110 and/or lamp assembly may likewise be configured with a similar discontinuous and/or non-uniform UV reflective coating (i.e., having similar coating free areas or regions 134a) on the inside or lamp-facing surface thereof.

In practice, the discontinuous UV reflective coating on the inside or lamp-facing surface of the exterior reflector 134 makes the exterior reflector 134 non-uniformly reflective to UV radiation or light emitted from the corresponding UV lamp 110. That is to say, the coating free areas or regions 134a permit or promote UV radiation or light absorption or transmittance at or through their corresponding locations on the exterior reflector 134, and thereby reduce reflection therefrom, for example, as compared to where the UV reflective coating resides. In some suitable embodiments, the locations and/or arrangement of the coating free areas or regions 134a are selected or otherwise made to result in a plurality of different zones within the exterior reflector 134 with different coating free area or region densities and/or different transmittances. In this way, the composite or resulting reflectance of UV radiation or light from the exterior reflector 134 may be tuned or adjusted to help minimize or eliminate relatively high intensity UV light "hot spots" being formed that could potentially otherwise be experienced on the semiconductor wafer W receiving the reflected UV light or radiation therefrom, for example, if the exterior reflector 134 where to be uniformly or otherwise continuously coated with the UV reflective coating. For example, as compared to when the exterior reflector 134 may be uniformly or otherwise continuously coated with the UV reflective coating, the discontinuous or non-uniformly coated exterior reflector 134 as disclosed herein advantageously provides more uniform UV irradiation of the semiconductor wafer W, and hence, shrinkage, for example, of the low-k material thin film or layer thereon and/or other like problems can be guarded against, resulting in a more even thickness of low-k material thin film or layer being UV cured and improved device yield, better device performance, etc.

Figure 3:
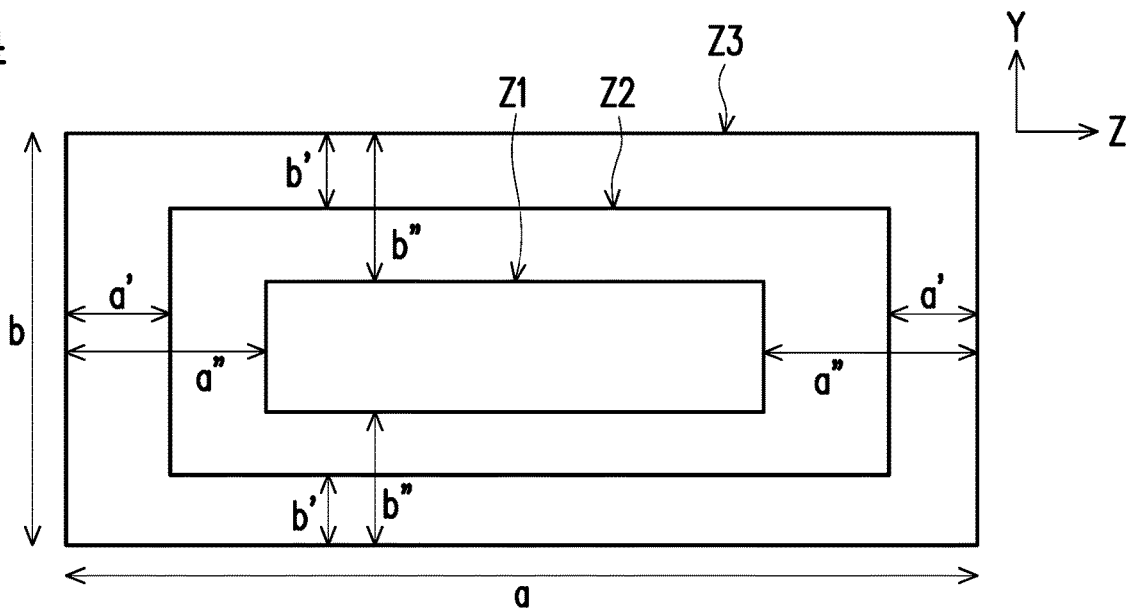
FIG. 3 diagrammatically illustrates a side view an exterior UV reflector in accordance with some embodiments disclosed herein.

With reference now to FIG. 3, an inside or lamp-facing surface of an exterior reflector 134 for a lamp 110 or lamp assembly of the UV light source and/or lamp unit 100 is shown in accordance with some suitable embodiments disclosed herein. As shown in FIG. 3, the inside or lamp-facing surface of the exterior reflector 134 is divided into a plurality of zones including, for example, a first zone Z3 (which encompasses the entire surface or substantially the entire surface), a second zone Z2 inside of first zone Z3 and a third zone Z1, inside of the second zone Z2. In the illustrated embodiment, the first zone Z3 may have a first dimension a along the length of the exterior reflector 134 and a second dimension b along a transverse direction in which the exterior reflector 134 arcs. For clarity, these dimensions a and b may also be seen in FIG. 2.

In some suitable embodiments, the second zone Z2 may be inset from the first zone Z3, for example, along both the Y and Z directions according to the depicted coordinate system. That is to say, each end of the second zone Z2 may be inset from each end of the first zone Z3 by an amount a', while each side of the second zone Z2 may be inset from each side of the first zone Z3 by an amount b'. Similarly, the third zone Z1 may be inset from the first zone Z3, for example, along both the Y and Z directions according to the depicted coordinate system. That is to say, each end of the third zone Z1 may be inset from each end of the first zone Z3 by an amount a", while each side of the third zone Z1 may be inset from each side of the first zone Z3 by an amount b". In some suitable embodiments, the dimension a' may be in a range of between from about 5% to about 15%, inclusive, of the dimension a. In some suitable embodiments, the dimension b' may be in a range of between from about 5% to about 15%, inclusive, of the dimension b. In some suitable embodiments, the dimension a" may be in a range of between from about 25% to about 35%, inclusive, of the dimension a. In some suitable embodiments, the dimension b" may be in a range of between from about 25% to about 35%, inclusive, of the dimension b. Advantageously, the foregoing ranges and/or configurations of zones helps and/or aids in promoting uniformity in an exposure of the semiconductor wafer W to UV irradiation by the UV light source and/or lamp unit 100 and can suitably better inhibit the creation of high intensity UV hot spots on the semiconductor wafer W, for example, as compared to other arrangements and/or as compared to other zone configurations, while still providing a suitable amount of reflection of UV light from the UV lamp 110 toward the semiconductor wafer W to promote efficient UV curing.

In some suitable embodiments, the density of the coating free areas or regions 134a (and/or the UV transmittance created thereby) in the third zone Z1 is greater than the density of the coating free areas or regions 134a (and/or the UV transmittance created thereby) in the second zone Z2; and the density of the coating free areas or regions 134a (and/or the UV transmittance created thereby) in the second zone Z2 is greater than the density of the coating free areas or regions 134a (and/or the UV transmittance created thereby) in the first zone Z3. In some suitable embodiments, the combined coating free areas or regions (and/or resulting transmittance) is in a range of between from about 10% to about 90%, inclusive, of the surface area in the first zone Z3. In some suitable embodiments, the combined coating free areas or regions (and/or resulting transmittance) is in a range of between from about 50% to about 100%, inclusive, of the surface area in the third zone Z1. In some suitable embodiments, the combined coating free areas or regions (and/or resulting transmittance) is in a range of between from about 20% to about 70%, inclusive, of the surface area in the second zone Z2. Advantageously, the foregoing ranges and/or arrangements of uncoated or coating free areas or regions and/or transmittance in the respective zones helps and/or aids in promoting uniformity in an exposure of the semiconductor wafer W to UV irradiation by the UV light source and/or lamp unit 100 and can suitably better inhibit the creation of high intensity UV hot spots on the semiconductor wafer W, for example, as compared to other arrangements and/or as compared to when the exterior reflector is completely or substantially completely coated with a UV reflective coating, while still providing a suitable amount of reflection of UV light from the UV lamp 110 toward the semiconductor wafer W to promote efficient UV curing.

Figure 4:
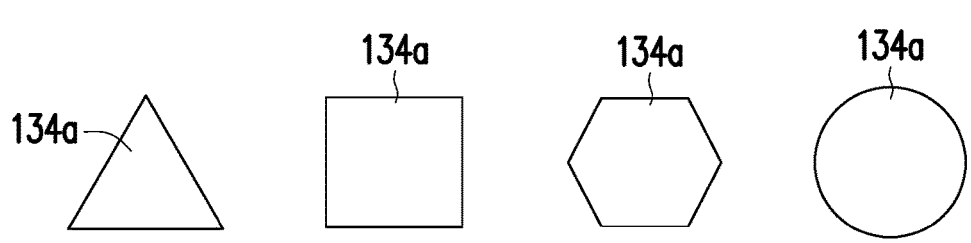
FIG. 4 diagrammatically illustrates various shapes of uncoated areas of an exterior UV reflector in accordance with some embodiments disclosed herein.

With reference now to FIG. 4, in some suitable embodiments, each coating free area or region 134a may take a variety of different shapes. For example, as shown, a coating free area or region 134a may take the shape of a triangle, a rectangle, a square, a hexagon or other polygon, a circle or other curved shape, etc. In some suitable embodiments, the size or dimension of a coating free area or region 134a may be in a range of greater than or equal to about 0.5 millimeters (mm).

In the following, some further illustrative embodiments are described.

In some embodiments, an ultraviolet (UV) lamp assembly of a UV curing tool is provided for curing a low dielectric constant (low-k) material layer of a semiconductor wafer. The UV lamp assembly includes: a UV lamp which emits UV light; a first reflector arranged proximate to a first side of the UV lamp, the first reflector including a first surface facing the UV lamp from which UV light emitted by the UV lamp is at least partially reflected; and a UV reflective coating partially coating the first surface of the first reflector. Suitably, a plurality of areas of the first surface of the first reflector remain uncoated with the UV reflective coating.

In some further embodiments, the UV lamp assembly further includes: a second reflector arranged proximate to a top of the UV lamp; and a third reflector arranged proximate to a second side of the UV lamp, the second side being opposite the first side In still additional embodiments, the first surface of the first reflector includes a plurality of zones and a density of the plurality of uncoated areas varies from at least one zone to at least one other zone such that a transmittance to UV light in at least two of the plurality of zones is different.

In some embodiments, the plurality of zones includes at least a first zone including an outer periphery region of the first surface and at least a second zone including a central region of the first surface; and the density of the uncoated areas in the second zone is greater than the density of the uncoated areas in the first zone.

In yet further embodiments, the UV reflective coating comprises one or more alternating layers of silicon dioxide ($SiO_2$) and zirconium dioxide ($ZrO_2$).

In some further embodiments, the uncoated areas are in a shape of at least one of a triangle, a rectangle, a square, a hexagon, a polygon, a circle and a curved shape.

In some embodiments, the first reflector is arced at least partially about the UV lamp.

In yet further embodiments, an ultraviolet (UV) curing apparatus is provided for curing a semiconductor wafer. The UV apparatus includes: a process chamber in which a semiconductor wafer is loaded for UV curing, the process chamber including a mounting assembly arranged to support the semiconductor wafer within the process chamber; and a UV light source including at least one UV lamp assembly. Suitably, the UV lamp assembly includes: a UV lamp which emits UV light; a first reflector arranged proximate to a first side of the UV lamp, the first reflector including a first surface facing the UV lamp from which UV light emitted by the UV lamp is at least partially reflected into the process chamber; and a UV reflective coating partially coating the first surface of the first reflector. Suitably, a plurality of areas of the first surface of the first reflector remain uncoated with the UV reflective coating.

In some embodiments, the UV lamp assembly further includes: a second reflector arranged proximate to a top of the UV lamp; and a third reflector arrange proximate to a second side of the UV lamp, the second side being opposite the first side.

In some further embodiments, the first surface of the first reflector includes a plurality of zones and a density of the plurality of uncoated areas varies from at least one zone to at least one other zone such that a reflectance of UV light in at least two of the plurality of zones is different.

In still further embodiments, the plurality of zones includes at least a first zone including an outer periphery region of the first surface and at least a second zone including a central region of the first surface; and the density of the uncoated areas in the second zone is greater than the density of the uncoated areas in the first zone.

In yet additional embodiments, the UV reflective coating comprises one or more alternating layers of silicon dioxide (SiO$_2$) and zirconium dioxide (ZrO$_2$).

In some further embodiments, the uncoated areas are in a shape of at least one of a triangle, a rectangle, a square, a hexagon, a polygon, a circle and a curved shape.

In some additional embodiments, the first reflector is arced at least partially about the UV lamp.

In some embodiments, the UV light source includes a plurality of UV lamp assemblies each including a corresponding UV lamp, a corresponding first reflector and a corresponding UV reflective coating as per the at least one UV lamp assembly.

In some embodiments, UV curing apparatus further includes a window interposed between the process chamber and the UV light source.

In some further embodiments, the window is made from at least one of quartz and synthetic quartz.

In still further embodiments, A method of ultraviolet (UV) curing of a semiconductor wafer having a low dielectric constant (low-k) material layer is provided. The method includes: generating UV radiation; and at least partially reflecting the generated UV radiation from a reflector toward a process chamber of UV curing tool in which a semiconductor wafer having a low-k material layer is loaded. Suitably, the reflector includes a surface facing a source from which the generated UV radiation is emitted, the surface having a UV reflective coating partially covering it. Suitably, a plurality of areas of the surface of the reflector remain uncovered by the UV reflective coating.

In yet further embodiments, the surface of the reflector includes a plurality of zones and a density of the plurality of uncovered areas varies from at least one zone to at least one other zone such that at least one of a reflectance or transmittance of UV radiation in at least two of the plurality of zones is different.

In still one more embodiment, the plurality of zones includes at least a first zone including an outer periphery region of the surface and at least a second zone including a central region of the surface; and the density of the uncovered areas in the second zone is greater than the density of the uncovered areas in the first zone.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ultraviolet (UV) lamp assembly of a UV curing tool for curing a low dielectric constant (low-k) material layer of a semiconductor wafer, said UV lamp assembly comprising:
a UV lamp which emits UV light;
a first reflector arranged proximate to a first side of said UV lamp, said first reflector including a first surface facing said UV lamp from which UV light emitted by said UV lamp is at least partially reflected; and
a UV reflective coating partially coating said first surface of the first reflector;
wherein a plurality of areas of the first surface of the first reflector remain uncoated with the UV reflective coating, the plurality of areas uncoated are located within a first zone encompassing the first surface, and the plurality of areas uncoated are each separated by said UV reflective coating partially coating said first surface of the first reflector.

2. The UV lamp assembly of claim 1, further comprising:
a second reflector arranged proximate to a top of said UV lamp; and
a third reflector arranged proximate to a second side of said UV lamp, said second side being opposite the first side.

3. The UV lamp assembly of claim 1, wherein the first surface of the first reflector includes a plurality of zones and a density of the plurality of uncoated areas varies from at least one zone to at least one other zone such that a transmittance to UV light in at least two of the plurality of zones is different.

4. The UV lamp assembly of claim 3, wherein:
the plurality of zones includes at least the first zone including an outer periphery region of the first surface and at least a second zone including a central region of the first surface; and
the density of the uncoated areas in the second zone is greater than the density of the uncoated areas in the first zone.

5. The UV lamp assembly of claim 1, wherein the UV reflective coating comprises one or more alternating layers of silicon dioxide (SiO$_2$) and zirconium dioxide (ZrO$_2$).

6. The UV lamp assembly of claim 1, wherein the uncoated areas are in a shape of at least one of a triangle, a rectangle, a square, a hexagon, a polygon, a circle and a curved shape.

7. The UV lamp assembly of claim 1, wherein the first reflector is arced at least partially about the UV lamp.

8. An ultraviolet (UV) curing apparatus for curing a semiconductor wafer, the UV apparatus comprising:
a process chamber in which a semiconductor wafer is loaded for UV curing, said process chamber including a mounting assembly arranged to support the semiconductor wafer within the process chamber; and
a UV light source including at least one UV lamp assembly, said UV lamp assembly comprising:
a UV lamp which emits UV light;
a first reflector arranged proximate to a first side of said UV lamp, said first reflector including a first surface facing said UV lamp from which UV light emitted by said UV lamp is at least partially reflected into the process chamber; and
a UV reflective coating partially coating said first surface of the first reflector;
wherein a plurality of areas of the first surface of the first reflector remain uncoated with the UV reflective coating, the plurality of areas uncoated are located within a first zone encompassing the first surface, and the plurality of areas uncoated are each separated by said UV reflective coating partially coating said first surface of the first reflector.

9. The UV curing apparatus of claim 8, wherein the UV lamp assembly further comprises:
   a second reflector arranged proximate to a top of said UV lamp; and
   a third reflector arranged proximate to a second side of said UV lamp, said second side being opposite the first side.

10. The UV curing apparatus of claim 8, wherein the first surface of the first reflector includes a plurality of zones and a density of the plurality of uncoated areas varies from at least one zone to at least one other zone such that a reflectance of UV light in at least two of the plurality of zones is different.

11. The UV curing apparatus of claim 10, wherein:
   the plurality of zones includes at least the first zone including an outer periphery region of the first surface and at least a second zone including a central region of the first surface; and
   the density of the uncoated areas in the second zone is greater than the density of the uncoated areas in the first zone.

12. The UV curing apparatus of claim 8, wherein the UV reflective coating comprises one or more alternating layers of silicon dioxide ($SiO_2$) and zirconium dioxide ($ZrO_2$).

13. The UV curing apparatus of claim 8, wherein the uncoated areas are in a shape of at least one of a triangle, a rectangle, a square, a hexagon, a polygon, a circle and a curved shape.

14. The UV curing apparatus of claim 8, wherein the first reflector is arced at least partially about the UV lamp.

15. The UV curing apparatus of claim 8, wherein the UV light source includes a plurality of UV lamp assemblies each including a corresponding UV lamp, a corresponding first reflector and a corresponding UV reflective coating as per the at least one UV lamp assembly.

16. The UV curing apparatus claim 8, further comprising a window interposed between the process chamber and the UV light source.

17. The UV curing apparatus of claim 16, wherein said window is made from at least one of quartz and synthetic quartz.

18. An ultraviolet (UV) lamp assembly of a UV curing tool for curing a low dielectric constant (low-k) material layer of a semiconductor wafer, said UV lamp assembly comprising:
   a UV lamp which emits UV light;
   a set of reflectors, comprising:
      a first reflector arranged proximate to a first side of said UV lamp,
      a second reflector arranged proximate to a top of said UV lamp, and
      a third reflector arranged proximate to a second side of said UV lamp, said second side being opposite the first side; and
   a UV reflective coating partially coating at least one of the set of reflectors,
   wherein a plurality of areas of the at least one of the set of reflectors remain uncoated with the UV reflective coating, and the plurality of areas uncoated are each separated by said UV reflective coating partially coating at least one of the set of reflectors.

19. The UV lamp assembly of claim 18, wherein the UV reflective coating partially coats a first surface of the first reflector, and wherein the first surface of the first reflector includes a plurality of zones and a density of the plurality of uncoated areas varies from at least one zone to at least one other zone such that a transmittance to UV light in at least two of the plurality of zones is different.

20. The UV lamp assembly of claim 19, wherein:
   the plurality of zones includes at least a first zone including an outer periphery region of the first surface and at least a second zone including a central region of the first surface; and
   the density of the uncoated areas in the second zone is greater than the density of the uncoated areas in the first zone.

* * * * *